US010473724B2

United States Patent
Aumer et al.

(10) Patent No.: US 10,473,724 B2
(45) Date of Patent: Nov. 12, 2019

(54) METHOD FOR DETERMINING A LOAD CURRENT AND BATTERY SENSOR

(71) Applicant: Continental Automotive GmbH, Hannover (DE)

(72) Inventors: Andreas Aumer, Burglengenfeld (DE); Hans-Michael Graf, Regensburg (DE); Martin Schramme, Königsbrunn (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 16/083,168

(22) PCT Filed: Mar. 21, 2017

(86) PCT No.: PCT/EP2017/056610
§ 371 (c)(1),
(2) Date: Sep. 7, 2018

(87) PCT Pub. No.: WO2017/186410
PCT Pub. Date: Nov. 2, 2017

(65) Prior Publication Data
US 2019/0094304 A1    Mar. 28, 2019

(30) Foreign Application Priority Data

Apr. 25, 2016    (DE) .......................... 10 2016 206 958

(51) Int. Cl.
*G01R 31/3835*  (2019.01)
*G01R 1/20*     (2006.01)
*G01R 35/00*    (2006.01)
*G01R 15/14*    (2006.01)

(52) U.S. Cl.
CPC ......... *G01R 31/3835* (2019.01); *G01R 1/203* (2013.01); *G01R 15/146* (2013.01); *G01R 35/005* (2013.01)

(58) Field of Classification Search
CPC .................... G01R 31/3835; G01R 15/146; G01R 35/005; G01R 1/203
USPC ............................................. 324/426
See application file for complete search history.

(56) References Cited

U.S. PATENT DOCUMENTS

| 2,644,923 | A | * | 7/1953 | Gregg, Jr. | G01R 21/00 136/224 |
| 2,742,610 | A | * | 4/1956 | Wolgast | G01R 27/22 324/705 |
| 2,830,252 | A | * | 4/1958 | Amey | B28B 7/08 323/229 |
| 3,048,776 | A | * | 8/1962 | Logan | G01N 27/041 324/717 |

(Continued)

FOREIGN PATENT DOCUMENTS

| DE | 102011078334 A1 | 1/2013 |
| JP | 62168067 A | 7/1987 |

OTHER PUBLICATIONS

German Examination Report for German Application No. 10 2016 206 958.6, dated Apr. 24, 2018, 7 pages.

(Continued)

*Primary Examiner* — Christopher P McAndrew
(74) *Attorney, Agent, or Firm* — RatnerPrestia (57) ABSTRACT

The invention relates to a method for determining a load current, which is based on conducting a calibration current in a particular manner and on particular calculation methods.

18 Claims, 5 Drawing Sheets

(56) References Cited

U.S. PATENT DOCUMENTS

| | | | | |
|---|---|---|---|---|
| 3,148,278 | A | * | 9/1964 | Wolfgang ............. G01G 9/005 250/359.1 |
| 3,436,659 | A | * | 4/1969 | Speheger ............. G01R 29/02 324/102 |
| 3,515,903 | A | * | 6/1970 | Striggow ............. H03K 17/725 327/453 |
| 3,873,917 | A | * | 3/1975 | Kreuzer ............. G01R 17/105 324/660 |
| 4,157,069 | A | * | 6/1979 | Gustafsson ............. F42D 1/05 102/200 |
| 4,163,935 | A | * | 8/1979 | Sakurada ......... G01R 19/16542 324/426 |
| 4,193,025 | A | * | 3/1980 | Frailing ............. G01R 31/379 324/427 |
| 4,528,499 | A | * | 7/1985 | Traub ............. G01R 17/105 324/610 |
| 4,713,607 | A | * | 12/1987 | Pepper ............. G01R 1/203 324/123 R |
| 4,843,306 | A | * | 6/1989 | Meuller ............. G01R 1/203 324/115 |
| 5,355,129 | A | * | 10/1994 | Baumann ............. G01D 3/022 324/601 |
| 5,563,541 | A | * | 10/1996 | Koga ............. G01R 19/25 307/137 |
| 6,429,641 | B1 | * | 8/2002 | Montrose ........... G01R 19/2509 323/277 |
| 6,909,275 | B2 | * | 6/2005 | Hartzsch ............. G01R 17/105 324/537 |
| 7,605,579 | B2 | * | 10/2009 | Betser ............. H02M 3/073 324/76.11 |
| 8,947,101 | B2 | | 2/2015 | Engl |
| 9,632,163 | B2 | | 4/2017 | Mueller et al. |
| 2008/0079415 | A1 | * | 4/2008 | Mirescu ............. G01R 1/203 324/76.11 |
| 2013/0054155 | A1 | * | 2/2013 | Jiang ............. G01R 1/203 702/41 |
| 2013/0113507 | A1 | * | 5/2013 | Danesh ............. G01R 21/133 324/713 |
| 2013/0119972 | A1 | * | 5/2013 | Maguire ............. G01R 35/005 324/74 |
| 2014/0191768 | A1 | | 7/2014 | Engl |
| 2014/0347072 | A1 | * | 11/2014 | Herrmann ........... G01R 35/005 324/601 |
| 2015/0160298 | A1 | | 6/2015 | Tabatowski-Bush |
| 2015/0177356 | A1 | * | 6/2015 | Wiater ............. G01D 18/00 324/98 |
| 2015/0369877 | A1 | * | 12/2015 | Frenzel ............. G01R 1/203 324/437 |
| 2016/0305989 | A1 | * | 10/2016 | Soma ............. G01R 19/32 |

OTHER PUBLICATIONS

German Search Report for German Application No. 10 2016 206 958.6, dated Feb. 10, 2017 with partial translation, 12 pages.
International Search Report and Written Opinion for International Application No. PCT/EP2017/056610, dated Jun. 7, 2017, 7 pages.
English translation of the Written Opinion for International Application No. PCT/EP2017/056610, dated Jun. 7, 2017, 6 pages.
Korean Office Action for Korean Application No. 10-2018-7026667, dated Jun. 26, 2019, with translation, 19 pages.

* cited by examiner

METHOD FOR DETERMINING A LOAD CURRENT AND BATTERY SENSOR

CROSS REFERENCE TO RELATED APPLICATIONS

This application is the U.S. National Phase application of PCT International Application No. PCT/EP2017/056610, filed Mar. 21, 2017, which claims priority to German Patent Application No. 10 2016 206 958.6, filed Apr. 25, 2016, the contents of such applications being incorporated by reference herein.

FIELD OF THE INVENTION

The invention relates to a method for determining a load current flowing through a group of measuring resistors.

BACKGROUND OF THE INVENTION

Such a method can be used, in particular, to determine the battery condition of a battery, for example an automobile battery. In order to determine a battery condition, it is typically necessary to measure the battery current. This can also be referred to as the load current. For this purpose, highly accurate resistors or sensors are typically used to measure the magnetic field strength in embodiments according to the prior art. The disadvantages of the previous embodiments are, in particular, the high costs, in particular for creating resistor materials which have more or less constant resistance values in a conventional temperature range of −40° C. to 105° C., for example. One example of such a material is a copper/nickel/manganese alloy, for example Manganin.

A current measurement may be provided, for example, for use in battery sensors for the downstream calculation of physical variables of a battery.

There have been approaches for some time to replacing a highly precise resistor as a measuring resistor, also referred to as a shunt resistor, with more cost-effective components. One possibility is to recalibrate a shunt resistor again and again over the service life of the battery sensor.

However, it has been found that continuous recalibration even while simultaneously measuring the high and temporally greatly variable currents occurring in the motor vehicle is difficult under the prevailing boundary conditions, in particular a desired low power consumption of the sensor, since the calibration current to be applied for calibration is intended to be selected to be small and is intended to be applied only briefly.

SUMMARY OF THE INVENTION

An aspect of the invention is a method for determining a load current which, in comparison with known embodiments, can be carried out in an alternative manner, for example in an improved and/or more cost-effective manner. Another aspect of the invention is an associated battery sensor.

An aspect of the invention relates to a method for determining a load current flowing through a group of measuring resistors. The group of measuring resistors has a number of branches and each branch has at least one respective first measuring resistor and one respective second measuring resistor. The method has the following steps for each of the branches:

measuring a first measurement voltage, which is dropped across the first measuring resistor, and a second measurement voltage, which is dropped across the second measuring resistor, calculating a first operating parameter on the basis of the first measurement voltage and the second measurement voltage, calculating the load current on the basis of at least the second measurement voltage and a second operating parameter, wherein the method has the following steps solely during respective calibration periods:

conducting a calibration current in the branch of the group of measuring resistors, wherein the calibration current is divided into a first calibration partial current flowing through the first measuring resistor and a second calibration partial current flowing through the second measuring resistor, and measuring a first calibration voltage, which is dropped across the first measuring resistor in the case of a flowing calibration current and load current, and a second calibration voltage, which is dropped across the second measuring resistor in the case of a flowing calibration current and load current, wherein the second operating parameter is calculated on the basis of at least the first calibration voltage, the second calibration voltage, the first operating parameter and a current intensity of the calibration current.

The method according to an aspect of the invention advantageously makes it possible to determine a load current. For this purpose, a measuring resistor originally comprising only a single resistor can be generalized as a group of measuring resistors having at least one branch with at least two measuring resistors. It should be understood that any desired number of branches can be used, that is to say one branch, two branches, three branches or more branches, for example.

The load currents may each be, in particular, those parts of an overall load current which flow through the respective branch.

It should be understood that a voltage dropped across a respective measuring resistor, that is to say a measurement voltage or calibration voltage, can fundamentally be measured both directly across the respective measuring resistor or can be measured in such a manner that an overall voltage is measured across a plurality of resistors, for example two resistors, and a voltage dropped across another resistor is subtracted therefrom. These embodiments are equivalent in the sense of this application and should both be accordingly included in the formulations used here.

It should be understood that, in the step of calculating the load current on the basis of at least the second measurement voltage and a second operating parameter, the first measurement voltage or a sum of the first measurement voltage and the second measurement voltage can also be used as an alternative to the second measurement voltage. Such variants should be considered to be equivalent.

In the case of a plurality of branches, the respective calculated load currents of the branches are preferably added to form an overall load current.

With regard to the details of the procedure, reference is made to the embodiments below.

The first calibration current is preferably different to, in particular in opposition to, the second calibration current based on a current direction of the load current. This results in advantageous solvability of systems of equations which are described in more detail further below.

According to one embodiment, the first calibration partial current is zero. This makes it possible to dispense with a current source and enable a particularly simple evaluation.

It should be understood that those embodiments in which a calibration partial current is therefore zero, for example, are included in the disclosure above.

The second operating parameter preferably corresponds to a product of a resistance value of the second measuring resistor and a gain factor of a voltmeter measuring the second measurement voltage.

The second operating parameter can be calculated, in particular, as the difference between a first fraction and a second fraction, wherein the numerator of the first fraction contains the second reference voltage, wherein the denominator of the first fraction contains the current intensity of the calibration current, wherein the numerator of the second fraction contains the first reference voltage, and wherein the denominator of the second fraction contains a product of the first operating parameter and the current intensity of the calibration current. This allows an advantageous calculation of the second operating parameter, in particular for the meaning stated above. With respect to the mathematical background, reference is made to the embodiment below.

It should be understood that, in the case of equations or formulas stated in this application, whether stated in text form or as a formula, certain transformations, in particular trivial transformations, are fundamentally also considered to be equivalent and do not depart from the scope of protection. For example, an equation can be multiplied by a constant.

The first operating parameter preferably corresponds to a ratio between a product of the resistance value of the second measuring resistor and the gain factor of a voltmeter measuring the second measurement voltage, and a product of the resistance value of the first measuring resistor and the gain factor of a voltmeter measuring the first measurement voltage.

In this case, the first operating parameter is preferably calculated by dividing the first measurement voltage by the second measurement voltage or by means of a regression analysis on the basis of the first measurement voltage and the second measurement voltage. This allows, in particular, an advantageous calculation of the first operating parameter for the meaning stated above.

The first operating parameter is preferably calculated outside calibration periods, in particular if the measurement voltages are also being measured.

According to one embodiment, the load current is calculated during respective calibration periods by extrapolating load currents from times outside calibration periods. This takes into account the fact that, depending on the embodiment, it may be difficult or even impossible to exactly calculate the load current during a calibration period, that is to say with a superimposed calibration current.

According to one embodiment, the first calibration partial current is zero, and the load current is calculated during respective calibration periods on the basis of the second calibration voltage, the second operating parameter and the current intensity of the calibration current. This takes into account, in particular, the fact that it is possible to exactly calculate the load current even during a calibration period, in particular if the first calibration partial current is zero.

In this case, the load current can be determined in two different exemplary ways, in particular. On the one hand, it can be calculated from the second calibration voltage, divided by the second operating parameter, minus the known calibration current and, on the other hand, it can be calculated from the first calibration voltage, divided by the product of the first and second operating parameters.

The end result is advantageously output or calculated as the mean value of the two methods just mentioned.

According to one embodiment, the load current is calculated outside calibration periods by dividing the second measurement voltage by the second operating parameter.

According to one embodiment, the load current is calculated during calibration periods by dividing the second calibration voltage by the second operating parameter minus a correction value, wherein the correction value is preferably the current intensity of the calibration current, in particular if the first calibration partial current is zero.

It would also be possible to use an estimated value for dividing the calibration current. On account of the typically known nominal resistance values of the first measuring resistor and of the second measuring resistor, it is typically possible to estimate how the current will be divided. As long as the calibration current is small in comparison with the load current, this usually produces only a small error.

The current intensity of the calibration current can be determined, in particular, on the basis of a measured voltage drop at a reference resistor, wherein this reference resistor is, in particular, a temperature-stable and/or long-term stable reference resistor. The latter has a known resistance.

It should be mentioned that the calibration current is therefore typically measured in the first instance only in total, that is to say without knowledge of the two calibration partial currents. Numerous possibilities are conceivable for measuring the calibration current. The voltage measurement across a reference resistor just mentioned is one example of this. Another possibility would be to obtain the calibration current from a precise current source.

According to one development, an error value for the load current is calculated on the basis of the current intensity of the reference resistor. This makes it possible to estimate the reliability of the determined load current.

An aspect of the invention further relates to a battery sensor.

The battery sensor has a group of measuring resistors, wherein the group of measuring resistors has a number of branches and each branch has at least one respective first measuring resistor and one respective second measuring resistor. The battery sensor has at least one first voltmeter and one second voltmeter, wherein the first voltmeter is configured to measure a voltage dropped across the first measuring resistor, and the second voltmeter is configured to measure a voltage dropped across the second measuring resistor. The battery sensor also has at least one calibration current source which is configured to conduct a calibration current through the group of measuring resistors. The battery sensor also has an electronic control apparatus which is configured to carry out a method according to an aspect of the invention. In respect of the method, reference can be made to all of the described embodiments and variants.

The method according to an aspect of the invention can be carried out in a particularly advantageous manner using the battery sensor according to an aspect of the invention. With regard to the associated advantages and variants, reference is made to the above description of the method.

The electronic control apparatus can have, in particular, processor means and storage means, wherein the storage means store program code, during the execution of which the processor means carry out a method according to an aspect of the invention or behave accordingly.

According to one embodiment, the group of measuring resistors has a single branch. This corresponds to a simple embodiment.

According to one embodiment, the group of measuring resistors has a plurality of branches. This makes it possible to take into account different current intensities, for example.

A number of multiplexers may also be provided in order to assign a voltage measurement and/or conduction of the calibration current to a particular branch. This makes it possible to use measuring instruments or current sources for different branches, which saves expenditure.

The group of measuring resistors may have a plurality of branches. In this case, the load current is preferably calculated in a manner summed over all branches. In this case, it is possible to refer to an overall load current which results from summing the respective load currents in the branches.

An aspect of the invention further relates to a nonvolatile, computer-readable storage medium which contains program code, during the execution of which a processor carries out a method according to an aspect of the invention. In respect of the method, reference can be made to all of the described embodiments and variants.

Further explanations of an aspect of the invention are given below, in which case this is used, on the one hand, to explain the function and, on the other hand, the features described herein can also be combined in any desired manner with features described elsewhere. They may likewise be combined with one another and may constitute aspects essential to an aspect of the invention separately or in combination.

A load current Iload to be measured is determined using a group of resistors through which the load current flows. The group of resistors has at least one first measuring resistor R1 and one second measuring resistor R2 which are connected in series with one another. Further measuring resistors R3, R4, ..., Rn−1, Rn connected in series may be connected in parallel with these partial resistors connected in series.

In addition to the load current, a calibration current or a plurality of calibration currents is/are occasionally fed into this resistor network or group of measuring resistors, with the result that a calibration current or a part of the calibration current or some of the calibration currents flow(s) via one or more of these measuring resistors together with the load current or a part of the load current. The measuring resistors can be considered to be partial resistors of the group of measuring resistors.

In this case, the voltage drop across one or more partial resistors of the resistor network, which is caused by the sum of currents flowing via a measuring resistor, is measured.

The points at which the calibration current(s) is/are fed into the group of measuring resistors and the points via which the voltage measurements are carried out at the measuring resistors through which the current flows can now be selected in such a manner that a solvable system of equations results:

$$U_m = (I_{load,i} + I_{ref,m}) * R_m * g_m$$

$$U_n = (I_{load,i} + I_{ref,n}) * R_n * g_n$$

In this case
$U_m$, $U_n$ are the measured calibration voltages across one or more measuring resistors with the number m, n,
$R_m$, $R_n$ are the (unknown) measuring resistors across which the calibration voltages $U_m$, $U_n$ are measured.

The measuring resistors may in turn comprise further measuring resistors connected in series or in parallel,
$g_m$, $g_n$ are the (erroneous) gain factors of the measuring devices for the voltages $U_m$, $U_n$,
$I_{load,i}$ is the load current to be measured or a part of this load current which flows via the measuring resistors in the group of measuring resistors used to measure calibration voltages $U_m$, $U_n$,
$I_{ref,m}$ and $I_{ref,n}$ are applied calibration partial currents which flow via the measuring resistors $R_m$, $R_n$ in the group of measuring resistors used to measure the calibration voltages $U_m$, $U_n$, wherein $I_{ref,m}$ and $I_{ref,n}$ flow in different directions based on $I_{load,i}$.

In particular, the calibration partial currents or the calibration current is/are periodically applied, for example with a period duration of between 10 ms and 100 ms for a duration from a period of between 10 µs and 100 µs. The result is therefore times during which calibration currents or parts of the latter flow through measuring resistors in the group of measuring resistors, that is to say calibration periods, and times during which no calibration currents flow through the group of measuring resistors. At these times, that is to say outside calibration periods, at least some of the equations in the system of equations are simplified as $$U_m = I_{load,i} * R_m * g_m$$

$$U_n = I_{load,i} * R_n * g_n$$

In this case, $U_m$, $U_n$ denote measurement voltages, that is to say voltages measured outside calibration periods.

Alternatively, temporally variable calibration currents can be applied at the times during which calibration currents flow, that is to say within calibration periods.

Relationships $\alpha_{mn}$ are advantageously formed between individual equations in the system of equations (or between measured voltages $U_i$) at times during which no calibration currents flow through the network (for example in a microcontroller which may be part of a current measuring apparatus or may be connected to the latter):

$$U_m = \alpha_{mn} * U_n$$

or $$U_m = \alpha_{mn} * I_{load,j} * R_n * g_n$$

For example, voltage value pairs $U_n(t)$, $U_m(t)$ measured at the same times tin each case can be stored. These stored value pairs can be evaluated in the microcontroller by means of linear regression in order to determine the relationship $\alpha_{mn}$. This corresponds to a calculation rule for the above-mentioned first operating parameter.

With the calibration currents switched on, it is advantageously now possible to determine that part of the load current to be measured by measuring the voltages $U_m$, $U_n$ $$U_m = \alpha_{mn} * (I_{load,i} + I_{ref,m}) * R_n * g_n$$

$$U_n = (I_{Load,i} + I_{ref,n}) * R_n * g_n$$

as follows:

$$\frac{U_m}{\alpha_{mn} * R_n * g_n} = I_{load,i} + I_{ref,m}$$

$$\frac{U_n}{R_n * g_n} = I_{load,i} + I_{ref,n}$$

$$\frac{U_n}{R_n * g_n} - \frac{U_m}{\alpha_{mn} * R_n * g_n} = I_{ref,n} - I_{ref,m}$$

-continued $$\frac{U_n}{(I_{ref,n}-I_{ref,m})} - \frac{U_m}{\alpha_{mn}*(I_{ref,n}-I_{ref,m})} = R_n * g_n$$

$$I_{load,i} = \frac{U_n}{R_n * g_n} - I_{ref,n}$$

The penultimate formula indicates a calculation rule for the second operating parameter.

At times during which no calibration current is applied, $I_{ref,m}=0$ and $I_{ref,n}=0$, and the last equation can be used to determine the load current $I_{load}$ to be measured.

With known $R_n$, $g_n$, alpha$_{nm}$, the following equation can be advantageously used to determine $I_{load}$:

$$I_{load,i} = \frac{1}{2} * \left( \frac{U_m}{R_m * g_m} + \frac{U_n}{R_n * g_n} - I_{ref,m} - I_{ref,n} \right)$$

$I_{load}$ can also be approximately calculated back from the sum of the two equations for the times during which the calibration current is switched on:

$$I_{load,i} = \frac{1}{2} * \left( \frac{U_m}{R_m * g_m} + \frac{U_n}{R_n * g_n} - I_{ref,m} - I_{ref,n} \right) =$$
$$\frac{1}{2} * \left( \frac{U_m}{R_m * g_m} + \frac{U_n}{R_n * g_n} \pm ||I_{ref,m}|-|I_{ref,n}|| \right)$$

An error is produced in this case, in particular when the currents $I_{ref,m}$ and $I_{ref,n}$ differ greatly.

The value $I_{ref,m}-I_{ref,n}$ is known in this case and corresponds to the calibration current, that is to say to the sum of the calibration partial currents. The different mathematical signs are taken into account in this case.

Figure 1:
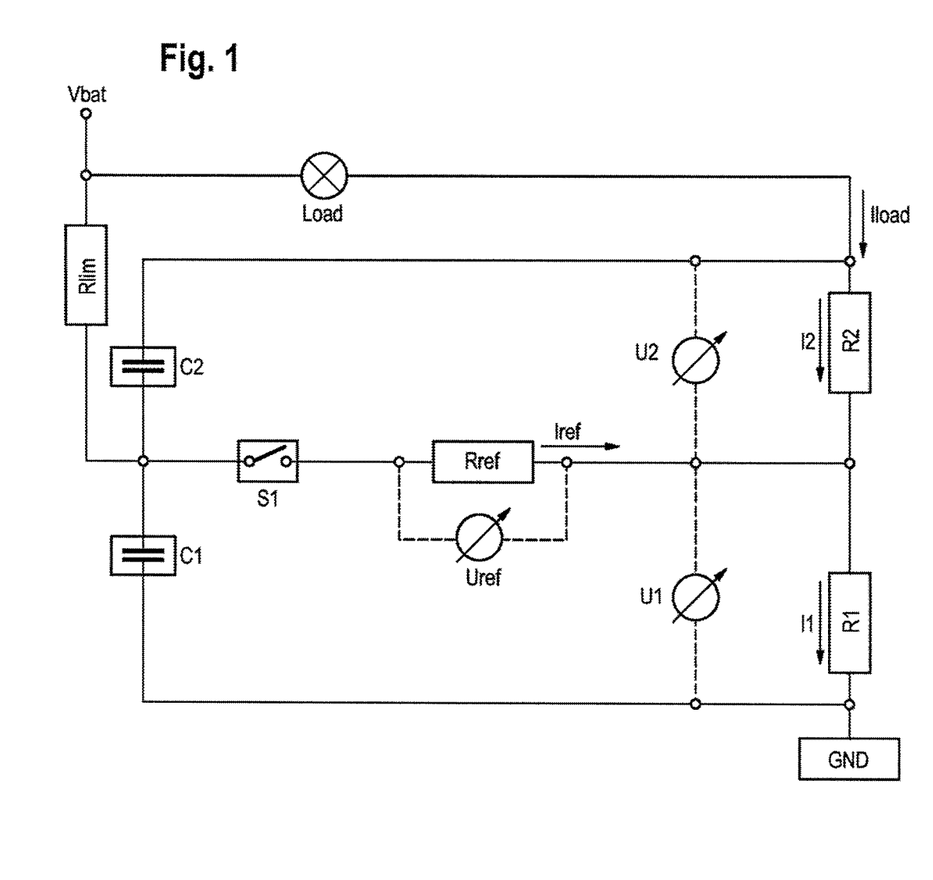
FIG. 1: shows a group of measuring resistors with connection according to a first exemplary embodiment.

In the case of FIG. 1 described in more detail further below, the measurement of $I_{load}$ can be interrupted for the moment of the calibration process. For example, the measured value of $I_{load}$ for the calibration time can be formed from mean values of measured values before the calibration time and measured values after the calibration time. Alternatively, it is possible to decide whether the erroneous measured value is used or whether a replacement value is formed. The decision can be made, for example, on the basis of an instantaneous value of the "symmetry factor" $\alpha_{mn}$ in comparison with earlier values of $\alpha_{mn}$. However, the decision may also be made dependent on the size of the ratio of the error in comparison with the applied load current.

In this case, an advantage of the configuration in FIG. 2 described further below is apparent. Since the calibration current is applied only to one branch of the resistor network at a calibration time in each case, the relative error caused by $\pm ||I_{ref,m}|-|I_{ref,n}||$ becomes smaller in relation to the sum of currents flowing through all branches. The respectively applied load current can be exactly calculated for the branches which are currently not calibrated since the sum of $U_n$ and $U_m$ is the same for all branches at any time irrespective of whether or not one of the branches is currently calibrated.

The measuring resistors $R_1$, $R_2$, . . . , $R_{z-1}$, $R_z$ and the apparatuses for measuring the voltages $U_n$, $U_m$ may have tolerances or deviations from the desired value of virtually any desired size. The value of the calibration current also does not play a decisive role.

Only the following prerequisites are advantageously complied with:

Firstly: The ratio $\alpha_{mn}$ of two products $R_n*g_n$, $R_m*g_m$ of measuring resistances $R_n$ and $R_m$ and gain factors $g_n$, $g_m$ to one another is intended to be substantially stable over a certain period. This certain period should be considerably longer than the period duration with which the periodically applied calibration currents are connected and disconnected or are periodically changed.

Secondly: The value of the calibration current $I_{ref}=I_{ref,n}-I_{ref,m}=|I_{ref,n}|+|I_{ref,m}|$ should be known exactly at at least one time at which $U_n$ and $U_m$ are measured with the calibration current applied.

It should now be pointed out that
1) the voltage drop is increased in one measuring resistor and the other is reduced, and
2) the resistance is calculated from the difference between the two measurement voltages.

This enables an up-to-date measurement of the resistance. Therefore, the resistance need not be permanently constant. More cost-effective materials can be used.

The described arrangement and the described method make it possible to determine the load current practically without prior knowledge of the resistor network or the group of measuring resistors and the relative accuracy of the measuring devices used to measure the voltages. As a result, despite the more cost-effective material, it is even possible to achieve a higher accuracy of the current measurement than in embodiments according to the prior art. This is because substantially both the tolerance of the resistance value of the measuring resistor and the tolerance of the voltage measuring apparatus for the voltage drop were previously included in the tolerance of the measured current value.

Typically, only accurate knowledge of $I_{ref}$ at one time is required with the apparatus or arrangement described. In addition, virtually no demands are imposed on the quality of the current source for $I_{ref}$. Only an accurate measurement of $I_{ref}$ is typically required. This can be easily achieved, for example, with an accordingly accurate reference resistor $R_{ref}$ and an accurate measurement of the voltage drop across $R_{ref}$. This is because, unlike the measuring resistor for the load current, $R_{ref}$ can have a high resistance of 1 ohm, for example, which needs to be designed only for small reference currents and not for high load currents. As a result of the value of $R_{ref}$ which is accordingly selected to be high, the voltage drop $I_{ref}*R_{ref}$ can also be conveniently measured since there is no need for a complicated amplifier, for example.

It should be understood that the first operating parameter is alpha$_{nm}$, in particular, and the second operating parameter is the product of the resistance and the gain factor, in particular.

BRIEF DESCRIPTION OF THE DRAWINGS

Further features and advantages will be gathered by a person skilled in the art from the exemplary embodiments described below with reference to the appended drawing, in which.

DETAILED DESCRIPTION OF THE PREFERRED EMBODIMENTS

FIG. 1 shows a group of measuring resistors with connection according to a first exemplary embodiment which can also be advantageously used to carry out the method according to an aspect of the invention.

The group of measuring resistors has a first measuring resistor R1 and a second measuring resistor R2, via which a temporally variable load current Iload is conducted. This load current Iload initially comes from a battery which is depicted, in terms of voltage, as Vbat in FIG. 1. The load current Iload also flows via a load which is generally referred to as Load and is only schematically illustrated here and may comprise typical electrical components of a motor vehicle, for example a starter motor, a vehicle light or electronic components as well as a generator.

A first voltmeter U1 is arranged across the first measuring resistor R1. A second voltmeter U2 is arranged across the second measuring resistor R2. These are designed to measure respective voltages across the two measuring resistors R1, R2 when a current I1, I2 is respectively flowing through.

A first capacitor C1 and a second capacitor C2 are used as current sources for a calibration current Iref and are directly charged from the vehicle battery via a series resistor Rlim. The load current Iload is generated from the battery Vbat via the load Load and flows to ground GND via the resistor network of the measuring resistors R1, R2.

The two capacitors C1, C2 are connected to a point between the first measuring resistor and the second measuring resistor via a switch S1 and a reference resistor Rref. The two voltmeters U1, U2 are also connected to this point. A further voltmeter Uref is arranged across the reference resistor Rref and measures a voltage dropped across the reference resistor Rref when a calibration current Iref is flowing through.

As a result of the switch S1 being closed, a calibration current Iref is therefore fed into the resistor network comprising the measuring resistors R1, R2 in addition to the load current Iload, wherein the first capacitor C1 is substantially discharged via the first measuring resistor R1 and the second capacitor C2 is substantially discharged via the second measuring resistor R2. This consequently produces two calibration partial currents, namely a first calibration partial current Iref,1 and a second calibration partial current Iref,2, wherein the first calibration partial current Iref,1 flows through the first measuring resistor R1 and the second calibration partial current Iref,2 flows through the second measuring resistor R2. The two calibration partial currents Iref,1 and Iref,2 have mathematical signs which are opposite across the two measuring resistors R1, R2, whereas their sum Iref flows through the reference resistor Rref and can be measured using a voltage measurement, as already described.

The voltmeters U1, U2 for measuring the voltages dropped across the two measuring resistors R1, R2 are not explained in any further detail in the present case. The voltmeters U1, U2 each typically have at least one amplifier, generally with a variable gain factor, and each have an analog/digital converter or else a common analog/digital converter which can be connected to each amplifier via a multiplexer.

An arithmetic unit, for example an electronic control apparatus which may be in the form of a microcontroller, for example, is not depicted in FIG. 1. Such an electronic control apparatus can have, for example, processor means and storage means, wherein the storage means store program code, during the execution of which the processor means carry out a method according to an aspect of the invention. In particular, the processor means can calculate the load current Iload according to the formulas mentioned above. The arithmetic unit or the electronic control apparatus may preferably also have an interface for reading in the voltages U1, U2, Uref and an interface for controlling the switch S1.

It should be mentioned that, instead of the capacitors C1, C2, any desired other type of current source can be used. For example, it is possible to use DC/DC converters, a direct connection to the positive pole of a battery (with or without series resistor Rlim), in-phase regulators, regulated precision current sources (in particular with omission of the Iref measurement via Rref) or else other suitable embodiments.

It should also be pointed out that parts of the calculations, in particular the calculation of a sum of voltages (Un, Um) measured across the measuring resistors and/or a difference between these voltages (Un−Um), can also be carried out in an analog form before the measured values are digitized.

Figure 2:
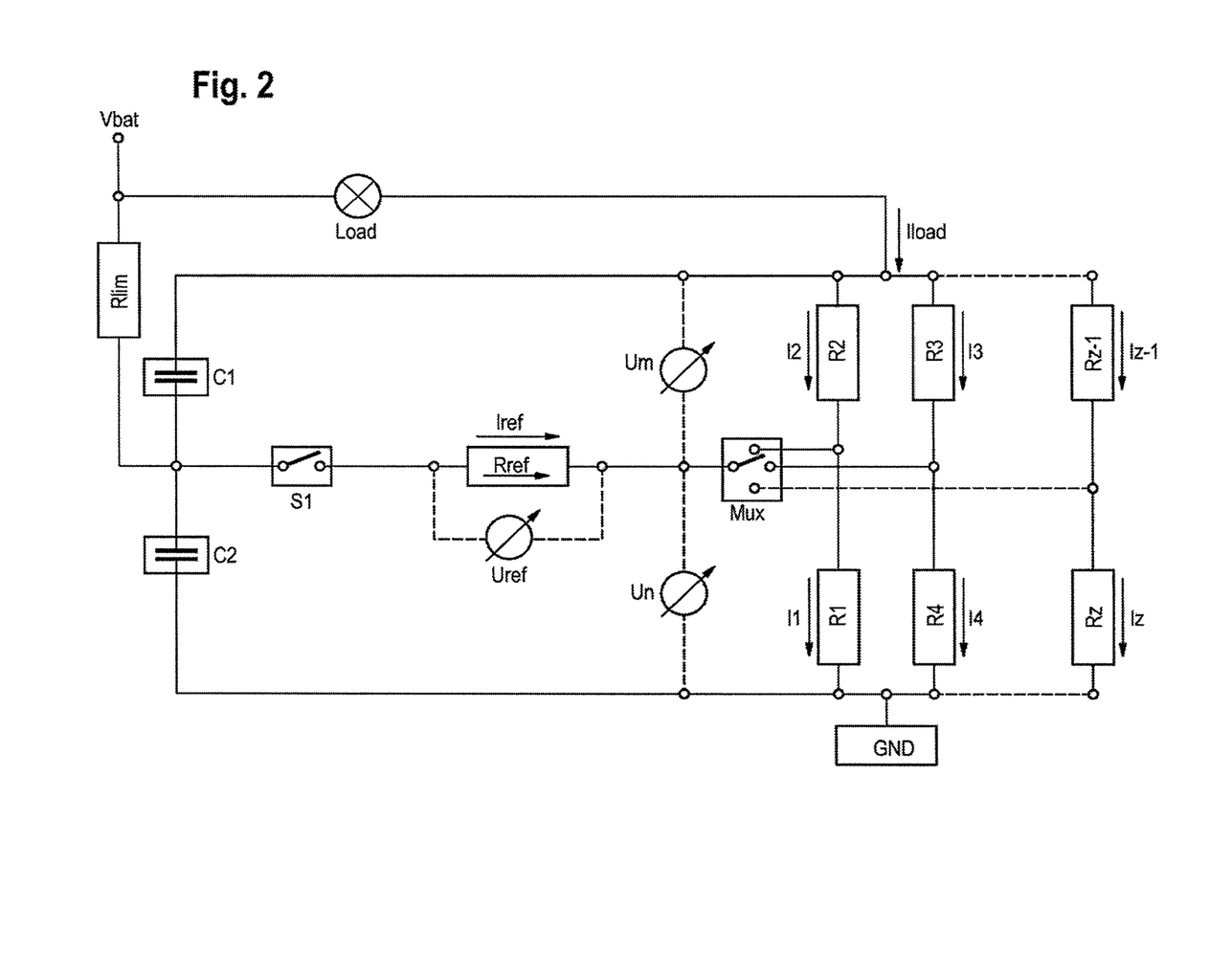
FIG. 2: shows a group of measuring resistors with connection according to a second exemplary embodiment.

FIG. 2 shows a group of measuring resistors with connection according to a second exemplary embodiment. It should be mentioned that the changes with respect to the previous figures are substantially discussed in FIG. 2 and in the further figures, in which case reference is made to the previous description with regard to elements which are not specifically mentioned.

In the embodiment according to FIG. 2, the resistor network or the group of measuring resistors comprises a plurality of measuring resistors R1, R2, R3, R4, . . . , Rz, Rz−1 connected in parallel and in series. One advantage of this embodiment is, in particular, that an overall lower measuring resistance is achieved in the Iload path as a result of a plurality of resistor branches being connected in parallel, whereas the measuring resistors R1, R2, . . . , Rz−1, Rz can be relatively large. Therefore, even with a low applied calibration current in comparison with the load current, a relatively high, that is to say easily measurable, voltage drop is produced at the respective measuring resistor. The calibration currents Iref and the voltmeters Un, Um can be assigned to any desired branch (R1, R2), (R3, R4), . . . , (Rz−1, Rz) via the multiplexer Mux.

Instead of the multiplexer for jointly switching the reference currents and the measurement variable, it may be advantageous to use two or more multiplexers, one of which is used to switch the reference currents and a second of which is used to connect the voltmeters to the respective branch of the resistor network.

Instead of the multiplexer Mux, it is also possible to use one current source and/or one voltage measuring device for each measuring resistor R1, R2, . . . , Rz−1, Rz, for example.

Figure 3:
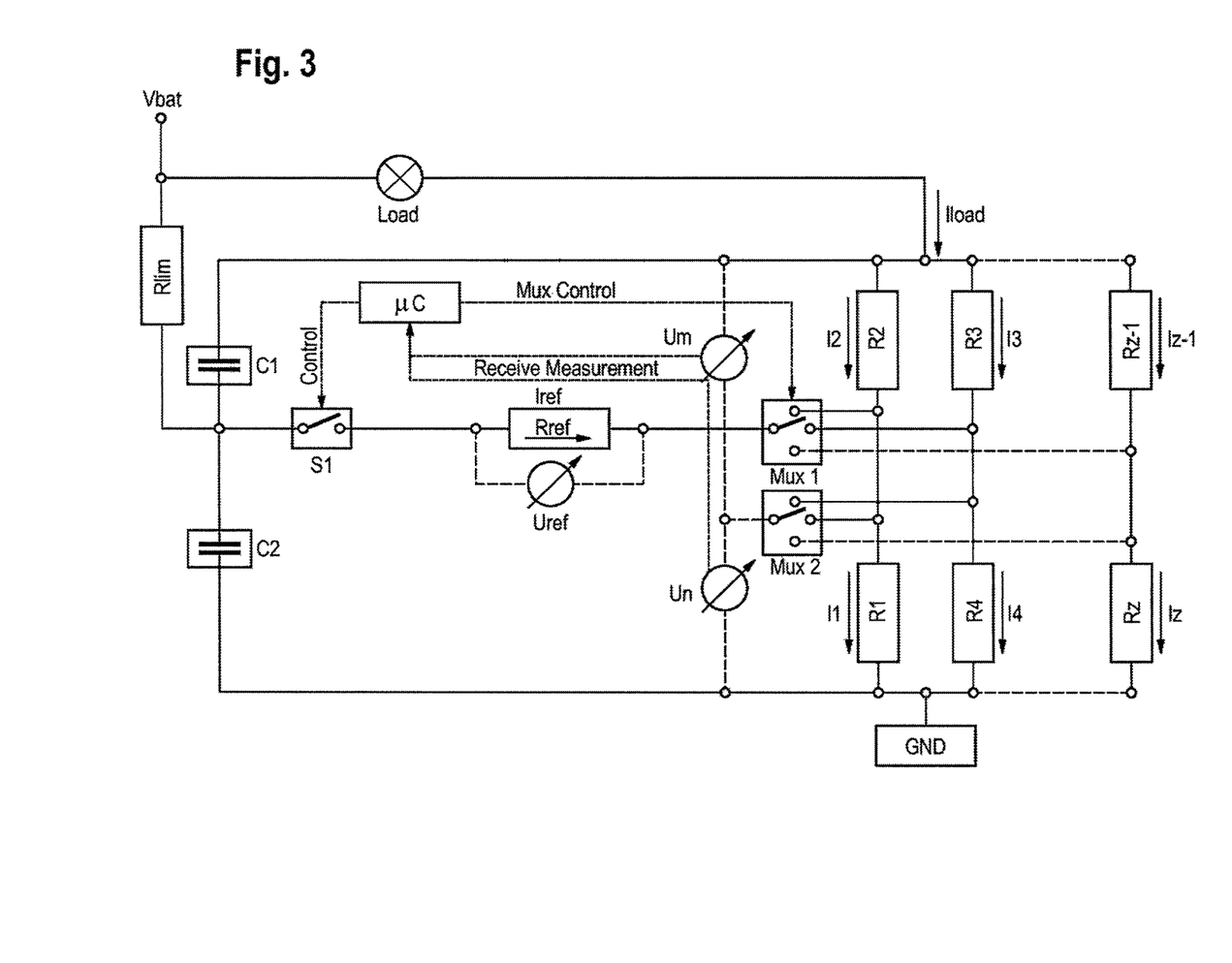
FIG. 3: shows a group of measuring resistors with connection according to a third exemplary embodiment.

FIG. 3 shows a group of measuring resistors with connection according to a third exemplary embodiment of an aspect of the invention. In this case, a separate multiplexer Mux1 is used to switch the calibration current Iref to any desired branch (R1, R2), (R3, R4), . . . , (Rz−1, Rz) of the resistor network and a second multiplexer Mux2 is used to connect the voltmeters Un, Um to any desired branch (R1, R2), (R3, R4), . . . , (Rz−1, Rz) of the resistor network. A microcontroller μC controls the multiplexers Mux1, Mux2 and the switch S1 and receives the measured values Un, Um, Uref.

The microcontroller μC is an electronic control apparatus and is configured to carry out a method according to an aspect of the invention. In this case, it is possible, in principle, to refer back to all the embodiments and variants described.

Figure 4:
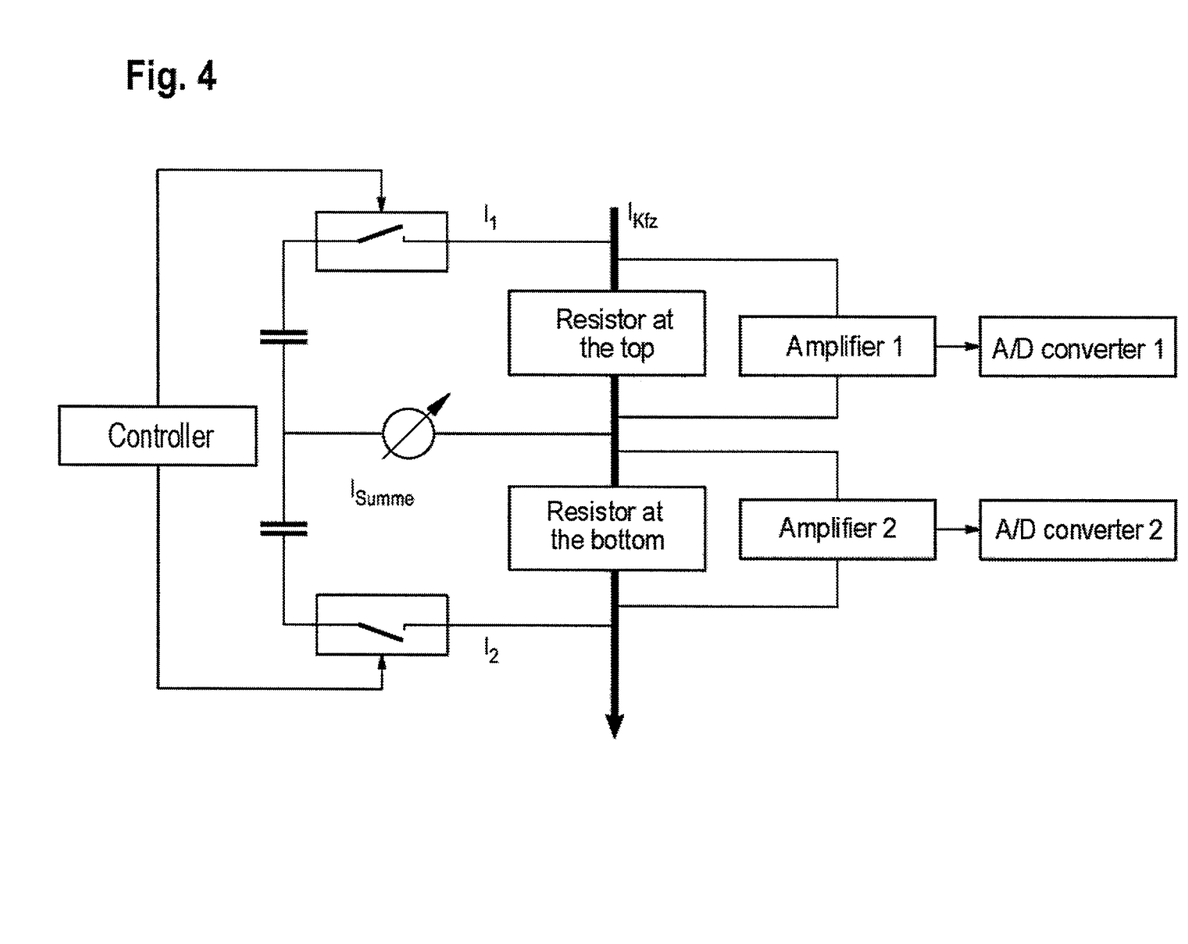
FIG. 4: shows a group of measuring resistors with connection according to a fourth exemplary embodiment.

FIG. 4 shows a group of measuring resistors with connection according to a fourth exemplary embodiment of an aspect of the invention, in which the calibration currents ISumme can be deliberately switched separately by the controller via different measuring resistors (resistor at the top, resistor at the bottom) of a resistor branch. The voltage measurement is divided, in detail, into the steps of amplification (amplifier 1, amplifier 2) and analog/digital conversion (A/D converter 1, A/D converter 2).

Figure 5:
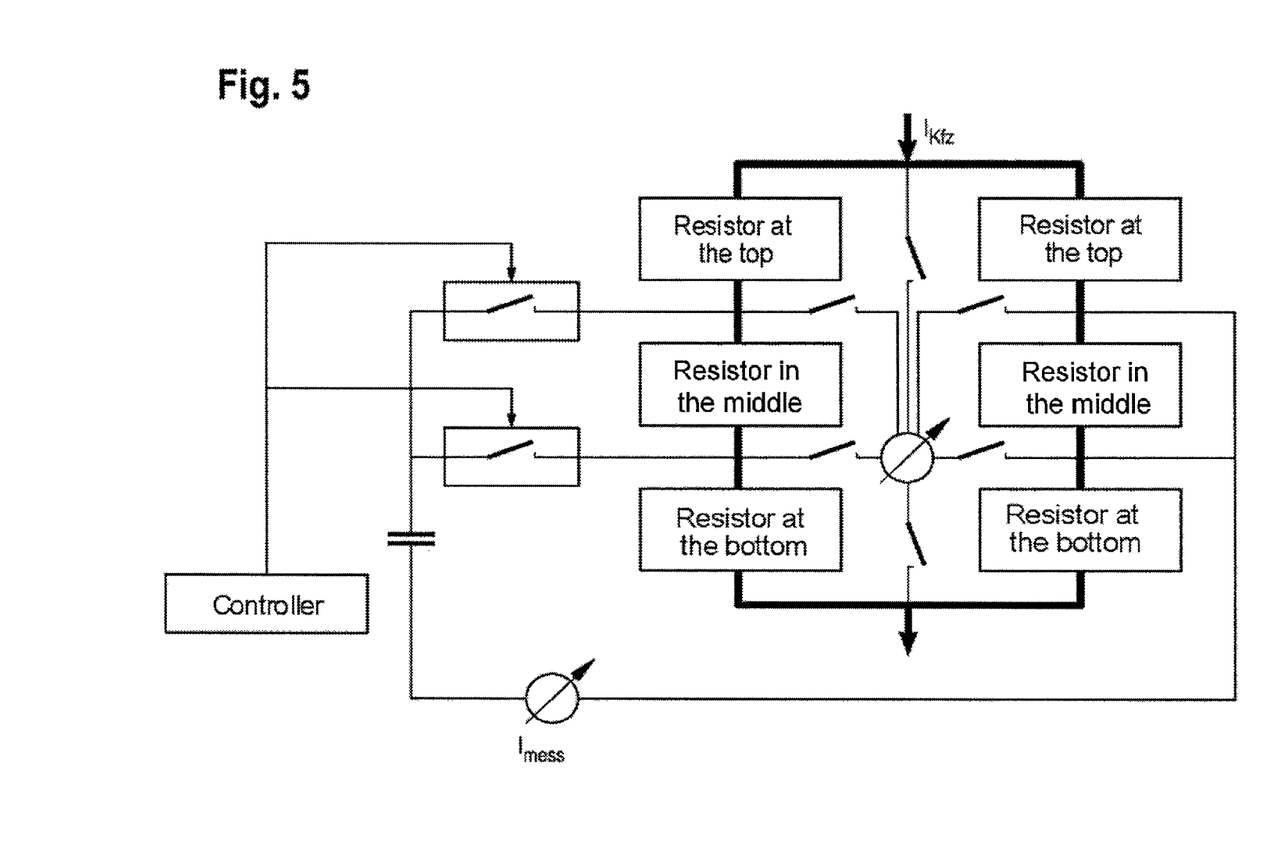
FIG. 5: shows a group of measuring resistors with connection according to a fifth exemplary embodiment.

FIG. 5 shows a group of measuring resistors with connection according to a fifth exemplary embodiment in which the resistor network contains three resistors connected in series (resistor at the top, resistor in the middle, resistor at the bottom) for each branch, to which the calibration current can be separately applied.

Any desired subsets of the circuits shown can be fitted with discrete components on a printed circuit board, for example, or integrated in a semiconductor device. In addition, the discrete circuit or the semiconductor device may have further apparatuses, for example temperature sensors, in particular for measuring the temperature, at least one of the resistors Rref, R1, R2, . . . , Rn, voltage sensors, in particular for measuring battery voltages, communication interfaces, apparatuses for controlling the current sources C1, C2, further current sources, clock generators, volatile and/or nonvolatile data memories, in particular for storing calibration data relating to the current measuring apparatus, for example a value of Rref determined in the manufacturing final test or a temperature coefficient of Rref, microprocessors, in particular for calculating physical variables of the battery or for calculating temperature models, in particular for calculating the battery temperature, the ambient temperature of the apparatus or for calculating a temperature of one or more of the resistors Rref, R1, . . . , Rz used.

The entire arrangement or any desired subset of the apparatus can be installed, for example, in a plastic or metal housing with or without an integrated connector or can be injection-molded with a plastic.

The entire arrangement or any desired subset of said apparatuses, in particular the measuring resistors or shunt resistors R1, . . . , Rz, can be integrated into a battery pole terminal, into a cable shoe, into a battery cable or into a battery.

The circuit may also contain one or more choppers for the voltages tapped off at the resistors Rref, R1, . . . , Rz.

The circuit may also contain one or more sample-and-hold elements for voltages tapped off at the resistors Rref, R1, . . . , Rz or for voltages tapped off or amplified there.

Finally, the calibration current Iref can also be measured using a current measuring method other than a voltage measurement using Iref, for example using a Hall sensor or other magnet-based measuring methods.

A derivation for the formulas mentioned above is also given below. Reference is made to the above description in respect of the meaning of the individual variables.

$$|I_{ref,1}| + |I_{ref,2}| = I_{ref}$$

$$I1 = I_{load} + |I_{ref,1}|$$

$$I2 = I_{load} - |I_{ref,2}|$$

$$U1 = R1 * g_1 * (I_{load} + |I_{ref,1}|)$$

$$U2 = R2 * g_2 * (I_{load} - |I_{ref,2}|)$$

$$a * R1 * g_1 = R2 * g_2$$

$$U2 = a * R1 * g_1 * (I_{load} - |I_{ref,2}|)$$

$$U1 - \frac{1}{a} * U2 = R1 * g_1 * (|I_{ref,1}| + |I_{ref,2}|)$$

$$R1 * g_1 = \frac{U1 - \frac{1}{a} * U2}{I_{ref}}$$

$$R2 * g_2 = a * R1 * g_1$$

Mentioned steps of the method according to an aspect of the invention can be executed in the indicated order. However, they can also be executed in a different order. In one of its embodiments, for example with a specific combination of steps, the method according to an aspect of the invention can be executed in such a way that no further steps are executed. However, in principle, further steps can also be executed, even steps of a kind which have not been mentioned.

The claims that are part of the application do not represent any dispensing with the attainment of further protection.

If it turns out in the course of the proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of an aspect of the invention that are described in the various embodiments or exemplary embodiments and/or shown in the figures can be combined with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to an aspect of the invention. They can therefore also be individually included in claims for the purpose of distinction from the prior art.

For the purpose of better readability, some reference signs are represented in abbreviated form in the claims. The first operating parameter is thus denoted a, the second operating parameter is denoted R*g and the gain factor is denoted g. The indices used in the above description were dispensed with in this case.

The invention claimed is:

1. A method for determining a load current flowing through a group of measuring resistors, the group of measuring resistors has a number of branches and each branch has at least one respective first measuring resistor connected to at least one respective second measuring resistor at a connection point that is connected to a reference resistor, wherein the method comprises for each of the branches:

measuring a first measurement voltage, which is dropped across the first measuring resistor in response to the load current, and a second measurement voltage, which is dropped across the second measuring resistor in response to the load current, calculating a first operating parameter on the basis of the first measurement voltage and the second measurement voltage, calibrating each branch of the group of measuring resistors during respective calibration periods, wherein the method comprises solely during the respective calibration periods:

conducting a calibration current into the branch of the group of measuring resistors, wherein the calibration current is divided into a first calibration partial current flowing through the first measuring resistor and a second calibration partial current flowing through the second measuring resistor, and the calibration current flows through the reference resistor to the connection point, and measuring a first calibration voltage, which is dropped across the first measuring resistor in response to the case of a flowing first calibration partial current and the load current, and a second calibration voltage, which is dropped across the second measuring resistor in response to the flowing second calibration partial current and the load current, wherein a second operating parameter is calculated on the basis of at least the first calibration voltage, the second calibration voltage, the first operating parameter and a current intensity of the calibration current.

2. The method as claimed in claim 1, wherein the first calibration partial current is different to the second calibration partial current based on a current direction of the load current.

3. The method as claimed in claim 1, wherein the first calibration partial current is zero.

4. The method as claimed in claim 1, wherein the second operating parameter corresponds to a product of a resistance value of the second measuring resistor and a gain factor of a voltmeter measuring the second measurement voltage.

5. The method as claimed in claim 1, wherein the second operating parameter is calculated as the difference between a first fraction and a second fraction,
wherein the numerator of the first fraction contains the second reference voltage,
wherein the denominator of the first fraction contains the current intensity of the calibration current,
wherein the numerator of the second fraction contains the first reference voltage, and
wherein the denominator of the second fraction contains a product of the first operating parameter and the current intensity of the calibration current.

6. The method as claimed in claim 1, wherein the first operating parameter corresponds to a ratio between:
a product of the resistance value of, the second measuring resistor and the gain factor of a voltmeter measuring the second measurement voltage, and
a product of the resistance value of the first measuring resistor and the gain factor of a voltmeter measuring the first measurement voltage.

7. The method as claimed in claim 1, wherein the first operating parameter is calculated by dividing the first measurement voltage by the second measurement voltage or by means of a regression analysis on the basis of the first measurement voltage and the second measurement voltage.

8. The method as claimed in claim 1, wherein the load current is calculated during respective calibration periods by extrapolating load currents from times outside calibration periods.

9. The method as claimed in claim 1, wherein the first calibration partial current is zero, and wherein the load current is calculated during respective calibration periods on the basis of the second calibration voltage, the second operating parameter and the current intensity of the calibration current.

10. The method as claimed in claim 1, wherein the load current is calculated outside calibration periods by dividing the second measurement voltage by the second operating parameter,
and/or
wherein the load current is calculated during calibration periods by dividing the second calibration voltage by the second operating parameter minus a correction value, wherein the correction value is preferably the current intensity of the calibration current, in particular if the first calibration partial current is zero.

11. The method as claimed in claim 1, wherein the current intensity of the calibration current is determined on the basis of a measured voltage drop at a reference resistor, in particular a temperature-stable and/or long-term stable reference resistor, with a known resistance value.

12. The method as claimed in claim 1, wherein an error value for the load current is calculated on the basis of the current intensity of the reference resistor.

13. A battery sensor, comprising:
a group of measuring resistors, wherein the group of measuring resistors has a number of branches and each branch has at least one respective first measuring resistor connected to at least one respective second measuring resistor at a connection point that is connected to a reference resistor,
at least one first voltmeter and one second voltmeter, wherein the first voltmeter is configured to measure a voltage dropped across the first measuring resistor in response to a load current, and the second voltmeter is configured to measure a voltage dropped across the second measuring resistor in response to the load current,
at least one calibration current source which is configured to conduct a calibration current through the group of measuring resistors, and
an electronic control apparatus which is configured to calibrate each branch of the group of measuring resistors during respective calibration periods, wherein the calibration comprises solely during the respective calibration periods:
conducting a calibration current into the branch of the group of measuring resistors, wherein the calibration current is divided into a first calibration partial current flowing through the first measuring resistor and a second calibration partial current flowing through the second measuring resistor, and the calibration current flows through the reference resistor to the connection point and measuring a first calibration voltage, which is dropped across the first measuring resistor in response to the first calibration partial current and the load current, and a second calibration voltage, which is dropped across the second measuring resistor in response to the second calibration partial current and the load current, wherein a second operating parameter is calculated on the basis of at least the first calibration voltage, the second calibration voltage, the first operating parameter and a current intensity of the calibration current.

14. The method as claimed in claim 1,
wherein the group of measuring resistors has a single branch:
or
wherein the group of measuring resistors has a plurality of branches,
wherein a number of multiplexers are provided in order to assign a voltage measurement and/or conduction of the calibration current to a particular branch.

15. The method as claimed in claim 1,
wherein the group of measuring resistors has a plurality of branches, and
wherein the load current is calculated in a manner summed over all branches.

16. The method as claimed in claim 1, wherein the first calibration partial current is opposite the second calibration partial current based on a current direction of the load current.

17. The battery sensor as claimed in claim 13,
wherein the group of measuring resistors has a single branch:
or
wherein the group of measuring resistors has a plurality of branches,
wherein a number of multiplexers are provided in order to assign a voltage measurement and/or conduction of the calibration current to a particular branch.

18. The battery sensor as claimed in either of claim 13,
wherein the group of measuring resistors has a plurality of branches, and
wherein the load current is calculated in a manner summed over all branches.

* * * * *